US005175446A

United States Patent [19]

Stewart

[11] Patent Number: 5,175,446

[45] Date of Patent: Dec. 29, 1992

[54] DEMULTIPLEXER INCLUDING A THREE-STATE GATE

[75] Inventor: Roger G. Stewart, Neshanic Station, N.J.

[73] Assignee: Thomson, S.A., Courbevoie, France

[21] Appl. No.: 655,498

[22] Filed: Feb. 14, 1991

[51] Int. Cl.[5] .................. H03K 19/20; H03K 19/094; H03K 19/00

[52] U.S. Cl. .................................. 307/463; 307/449; 307/473; 307/482; 307/468

[58] Field of Search ............... 307/449, 463, 482, 465, 307/468, 469, 473, 475, 578

[56] References Cited

U.S. PATENT DOCUMENTS

| | | | |
|---|---|---|---|
| 4,725,742 | 2/1988 | Tachimori et al. | 307/463 X |
| 4,743,899 | 5/1988 | Szeto | 307/463 X |
| 4,843,261 | 6/1989 | Chappell et al. | 307/449 |
| 4,896,302 | 1/1990 | Sato et al. | 307/463 X |
| 4,937,476 | 6/1990 | Bazes | 307/482 X |
| 4,962,327 | 10/1990 | Iwazaki | 307/449 |
| 5,021,688 | 6/1991 | Leforestier | 307/463 |

*Primary Examiner*—Edward P. Westin
*Assistant Examiner*—Andrew Sanders
*Attorney, Agent, or Firm*—J. S. Tripoli; D. H. Irlbeck; L. L. Hallacher

[57] ABSTRACT

A demultiplexer includes a plurality of transistors having conduction paths connected between an input terminal and output nodes. The control electrode of every transistor is connected to one line of a most significant bit bus by a first capacitive device, the control electrode of every transistor is also coupled to one line of a least significant bit bus by a second capacitive device. When the capacitive devices associated with the same transistor simultaneously receive an enable signal the transistor is turned on and current flows from the input terminal to an output node. Each transistor within the demultiplexer thus acts as a three state gate.

16 Claims, 2 Drawing Sheets

DEMULTIPLEXER INCLUDING A THREE-STATE GATE

BACKGROUND

This invention relates generally to demultiplixers and particularly to a single stage circuit which functions as a two stage demultiplexer. In its broader aspects the circuit can be used as a three state gate.

Liquid crystal television and computer displays (LCDs) are known in the art. For example, see U.S. Pat. Nos. 4,742,346 and 4,766,430, both issued to G. G. Gillette et al. and incorporated herein by reference. Displays of the type described in the Gillette patents include a matrix of liquid crystal cells which are arranged at the crossovers of data lines and select lines. The select lines are sequentially selected to produce the horizontal lines of the display. The data lines apply the brightness signals to the columns of liquid crystal cells as the select lines are sequentially selected. Each liquid crystal cell is associated with a switching device through which a ramp voltage is applied to the liquid crystal cells in the selected line. Each of the switching devices is held on by a comparator, or a counter, which receives the brightness (grey scale) signal to permit the ramp voltage to charge the associated liquid crystal device to a voltage proportional to the brightness level received by the comparator from the data line. When the display is a color television display, the incoming signal is analog and must be digitized. Each data line of the display must therefore be associated with a demultiplexer having a sufficient number of stages to apply all data bits of the digitized brightness signal to the comparator for that line.

In the prior art two stage demultiplexers are utilized in order to reduce the lead count. For example, a display having a thousand data lines and eight bits of grey scale requires loading a total of eight thousand pieces of information for each image line and would require 180 leads (two times the square root of eight thousand). Even with an optimized single stage demultiplexer this is an excessive lead count. A two stage demultiplexer substantially reduces the lead count by a cube root relationship, instead of a square root relationship (three times the cube root of eight thousand). The lead count is thus reduced from 180 to 60 by the use of two stage demultiplexing.

A prior art two stage demultiplexing circuit is shown in FIG. 1. The demultiplexer 10 includes N sections 15-1 through 15-N, one for each bit of the digital word. Each section 15 includes a data input terminal 11, a capacitor 12, an input node 13, an intermediate node 14 and output nodes 16. The capacitor 12 stores the input data signal to keep node 13 at the data input level. Additional capacitors 17 and 18 keep nodes 14 and 16 respectively at their applied voltage levels. Each data input section 15 has a most significant bit (MSB) stage including a plurality of transistors 19 equal in number to the number of MSB lines (three of which Mi, M2, M3 are shown) in the stage. The control electrode of each transistor is connected to one of the MSB lines M. Each data input section 15 also has a least significant bit stage (LSB) including a plurality of transistors 21 equal in number to the number of LSB lines (four of which L1 to L4 are shown) in the stage. The control electrode of each transistor 21 is connected to one of the LSB lines L. Transistors 19 and 21 preferably are thin film transistors (TFT's). The conduction path of each MSB TFT 19 is connected in series with the conduction paths of all of the LSB TFT's 21. Accordingly, each input signal is connected to an output line through two TFT's. Thus, when an MSB line and an LSB line are simultaneously high current flows from input node 13 to an output node 16 through the conduction paths of the conductive TFT's. For example, when MSB line M2 and LSB line L3 are simultaneously high, transistors 19-2 and 21-3 are on and current flows from input node 13 to output node 16.

In a full voltage swing situation, the slow down caused by the drain to source impedance of two TFT's in series is approximately a factor of two, that is, approximately half as much current flows through the serial combination and it takes approximately twice as long to charge node 16. However, in high speed applications, such as those for LCD displays, the time available for signal transfer is very short and the signal swings on node 14 are not the full voltage swing. The full impact of a serial transistor combination in a high speed display therefore is much worse than a factor of two. In FIG. 2, the data input voltage 22 has a sharp rise and then is substantially flat. The voltage 23 on node 14 rises approximately linearly with time. However, the voltage 24 on node 16 rises much more slowly than that on node 14. This is because the current passing through the least significant bit decoder stage to output node 16 is proportional to the voltage on node 14, which rises approximately linearly with time. The actual voltage on output node 16 rises as a function of the square of time. Accordingly, for the short time period available for voltage transfer in LCD applications the signal coupled to node 16 is very small. The frequency response of this demultiplexer arrangement is therefore limited.

For these reasons there is a need for a single stage demultiplexer which enables the reduction in input line count that a two stage demultiplexer permits while simultaneously allowing the speed of operation necessary for LCD and other types of display devices. The present invention fulfills these needs.

SUMMARY

A demultiplexer having N sections for decoding an N bit digital signal includes an input terminal and an output node. A most significant bit bus (MSB) has a plurality of MSB lines and a least significant bit bus (LSB) has a plurality of LSB lines. A plurality of transistors have their conduction paths arranged between the input terminal and an output node. A plurality of pairs of capacitive coupling means are serially connected at junctions, with each of the junctions being connected to one of the control electrodes. One pair of capacitive coupling means is therefore arranged between each of the MSB lines and each of the LSB lines whereby every MSB line is coupled to every LSB line.

CROSS REFERENCE TO RELATED APPLICATION

This invention can be used with the invention described in application Ser. No. 600,046 filed on Oct. 19, 1990 by Dora Plus and Leopold A. Harwood and entitled "System For Applying Brightness Signals to a Display Device And Comparator Therefore".

DETAILED DESCRIPTION

Figure 3:
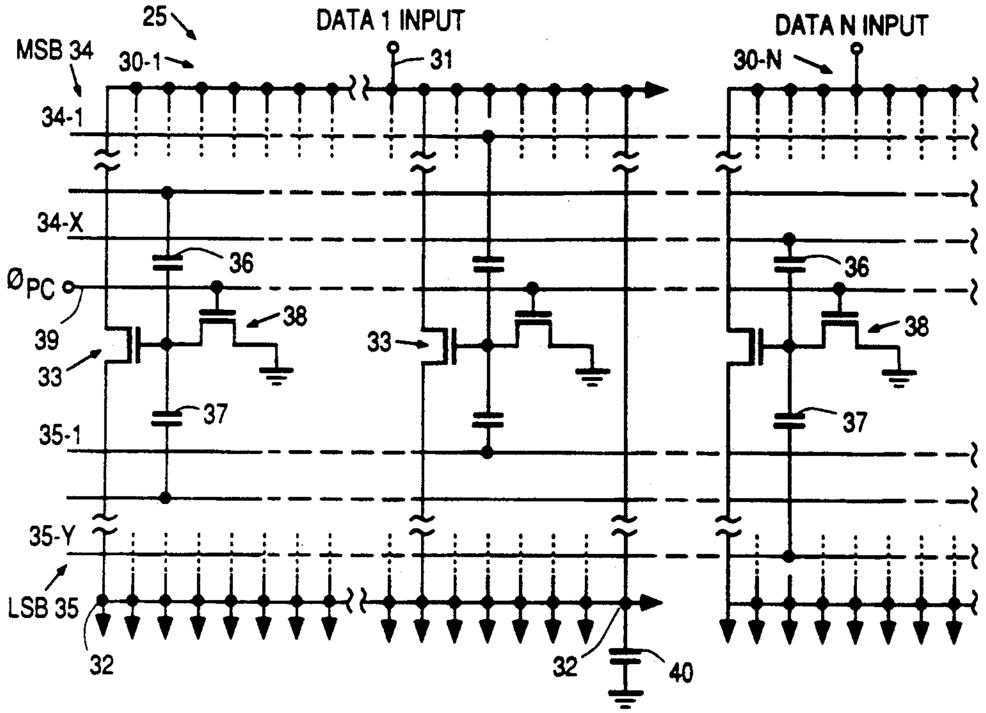
FIG. 3 is a preferred embodiment.

FIG. 3 shows a demultiplexer 25 having N sections 30-1 to 30-N for demultiplexing N signals. Each section 30 includes a data input terminal 31 and a plurality of output nodes 32. A plurality of solid state switching devices 33, which preferably are thin film transistors (TFT's) have conduction paths connected between input terminal 31 and respective output nodes 32. A most significant bit (MSB) bus 34 includes a first number of lines 34-1 to 34-X. A least significant bit (LSB) bus 35 includes a second number of lines 35-1 to 35-Y. The product of the total number of lines in MSB bus 34 and LSB 35 bus is equal to $2^N$. Thus, for example for $2^N=256$-to-one demultiplexer the MSB bus can include 32 lines and the LSB bus 8 lines. The control electrode of every TFT 33 is coupled to one of the MSB lines 34 by a signal coupling means 36, which preferably is a capacitor. Also, the control electrode of every one of the TFT's 33 is coupled by a coupling means 37, which also preferably is a capacitor, to one of the LSB lines 35. In effect the capacitors are serially connected at junctions, with the junctions connected to the control electrodes. The total number of thin film transistors 33 in each section 30 of the demultiplexer 25 is a multiple of the number of lines in the MSB bus times the number of lines in the LSB bus 35.

Additional thin film transistors 38 have conduction paths connected between the control electrode of the TFT's 33 and a reference potential. The control electrode of the TFT's 38 is connected to a precharge line 39 and accordingly the TFT's 38 serve as means for precharging the control electrodes of the TFT's 33 to a voltage about equal to the turn-off voltage of TFT's 33, in the example shown this voltage is ground.

Figure 1:
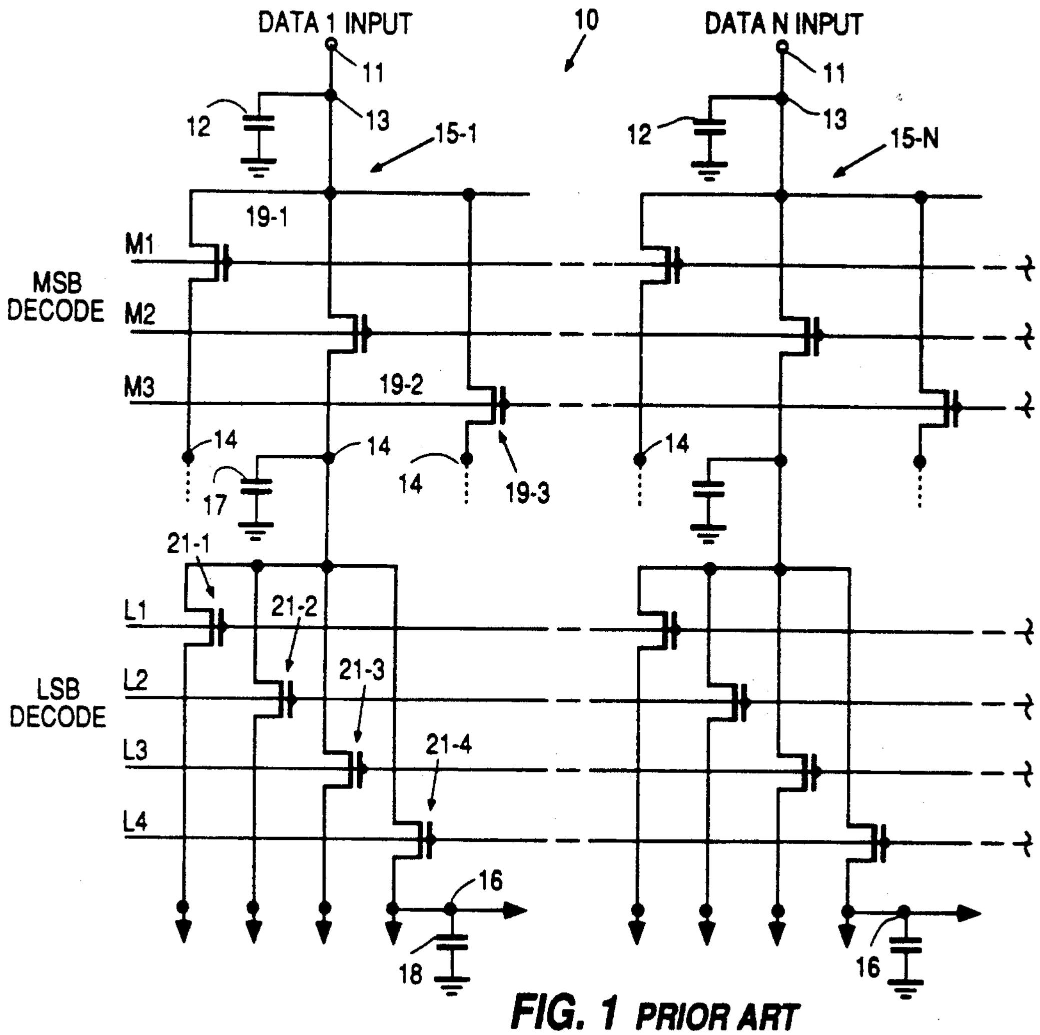
FIG. 1 PRIOR ART
FIG. 1 shows a prior art two-stage demultiplexer.
Figure 2:
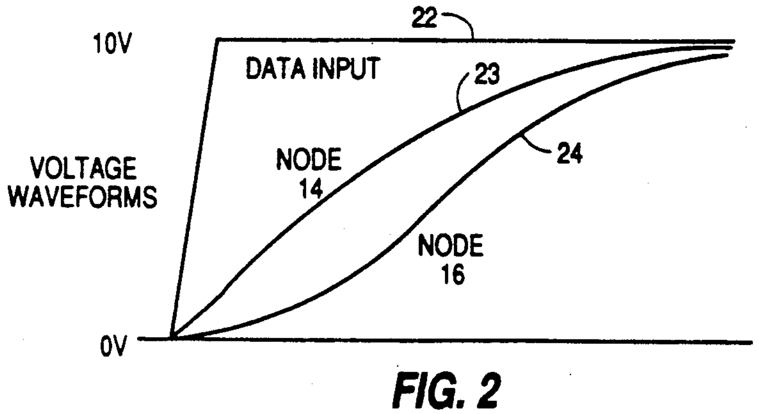
FIG. 2 shows the voltages applicable to the circuit of FIG. 1.

The invention shown in FIG. 3 eliminates node 14 of the prior art demultiplexer shown in FIG. 1 and thus, structurally looks like a single stage demultiplexer. However, the equivalent of two level demultiplexing is achieved by the coupling of the demultiplexing signal on each of the MSB lines and each of the LSB lines to the respective control electrodes through the capacitors 36 and 37, which are approximately equal. The precharge TFT's 38 are used to simultaneously precharge the control electrodes of the TFT's 33 of all sections 30 to a fixed potential before normal operation of the demultiplexer begins.

Figure 4A:
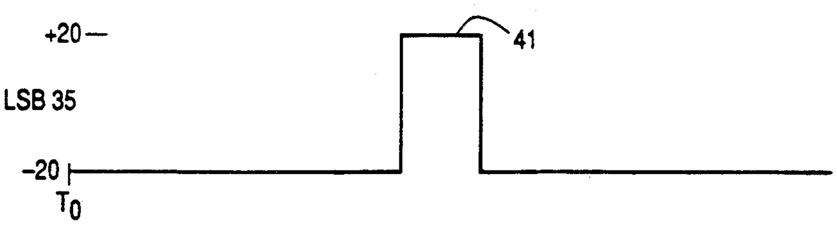
FIGS. 4*a* and 4*b* show exemplary LSB and MSB waveforms, respectively, for the embodiment of FIG. 3.
Figure 4B:
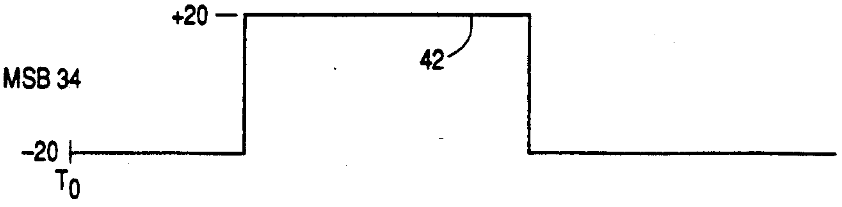

In operation, the MSB decode lines 34 and the LSB decode lines 35 operate over a range of −20 to +20 volts. Exemplary voltage waveforms which can be used for one of the LSB lines 35 and one of the MSB lines 34 are shown in FIGS. 4*a* and 4*b*, respectively. The duty cycles for the LSB and MSB waveforms are equal to the inverse of the number of lines in the bus to which the waveforms are applied. Also, the ratio of the enabling pulse widths is equal to Y, thus for the example given above, pulse 42 is eight times as wide as pulse 41. Assume that the potentials of the MSB and LSB lines are $V_M$ and $V_L$ respectively and that capacitors 36 and 37 are equal. The voltage coupled to the control electrode is substantially equal to $(V_M+V_L)/2$. Thus, when $V_M$ and $V_L$ both equal −20 volts the voltage to the control electrode is −20 volts. When either VM or VL is +20 volts and the other is −20 volts the voltage applied to the control electrode is zero. For all three of these conditions the TFT 33 remains at its precharged off state. When both VM and VL are equal to +20 volts, 20 volts is coupled to the control electrode of the TFT 33 and the TFT is turned on hard for a short interval determined by the pulse width of the narrowest width signal. A precharge pulse $\phi_{PC}$ is applied at the end of each line time to reset TFT's 33 to the desired precharge voltage.

The TFT's 33 remain off until two positive inputs are simultaneously received. Accordingly, in its broadest application the inventive circuit can be used as a single transistor three state gate. The inventive circuit is advantageous because it transfers voltage from input terminal 31 to output node 32 through a single transistor and therefore is sufficiently fast for use in a liquid crystal display. The inventive circuit is also advantageous because if reduces the output lead count by the same factor as prior two stage demultiplexers.

What is claimed is:

1. A demultiplexer having N sections for decoding a digital signal, each of said sections comprising:
- an input terminal and at least one output node;
- a most significant bus having a plurality of MSB lines and a least significant bus having a plurality of LSB lines;
- a plurality of transistors having control electrodes and having conduction paths coupled between said input terminal and an output node;
- a plurality of pairs of capacitive coupling means serially connected at junctions, each of said junctions being connected to one of said control electrodes, one pair of said capacitive coupling means being coupled between each of said MSB lines and each of said LSB lines.

2. The demultiplexer of claim 1 wherein said capacitive coupling means are substantially equal capacitors.

3. The demultiplexer of claim 2 further including means for precharging said control electrode to a voltage substantially equal to the turn-off voltage of said solid state switching device.

4. The demultiplexer of claim 1 further including means for precharging said control electrode to a voltage substantially equal to the turn-off voltage of said solid state switching device.

5. A demultiplexer having N sections for decoding an N bit digital signal, each of said sections comprising:
- an input terminal;
- at least output node;
- a plurality of solid state switching devices having a control electrode and a conduction path, the conduction path of each of said switching devices connecting said input terminal to an output node;
- a most significant bit bus having X MSB lines for receiving the most significant bits of said digital signal;
- a least significant bit bus having Y LSB lines for receiving the least significant bits of said digital signal, where $XY=2^N$;
- first and second signal coupling means, respectively coupling each of said control electrodes to one said MSB lines and to one of said LSB lines for actuating said switching devices to pass current from said input terminal to said output node when both of said signal coupling means receive a logic input having a selected level.

6. The demultiplexer of claim 5 wherein each of said most significant lines and each of said least significant lines receive different voltage waveforms having different pulse widths and varying between the same negative and positive values, and said solid state switching devices are turned on only when both of said voltages are simultaneously of the same polarity.

7. The demultiplexer of claim 5 further including means for precharging said control electrode to a voltage substantially equal to the turn-off voltage of said solid state switching device.

8. The demultiplexer of claim 7 wherein said means for precharging is a transistor.

9. The demultiplexer of claim 7 wherein said signal coupling means are substantially equal capacitors.

10. The demultiplexer of claim 5 wherein said signal coupling means are substantially equal capacitors.

11. A three state gate comprising:

a transistor having a control electrode and a conduction path for connecting said transistor between a voltage source and an output terminal;

first means for reactively coupling said control electrode to a first input signal;

second means for reactively coupling said control electrode to a second input signal, whereby current flows through said conduction path when said first and second means simultaneously receive enabling signals.

12. The three state gate of claim 11 wherein said means for coupling are substantially equal capacitors.

13. The three state gate of claim 11 further including means for precharging said control electrode to a voltage substantially equal to the turn off voltage of said transistor.

14. The three state gate of claim 13 wherein said means for precharging is an additional transistor.

15. The three state gate of claim 14 wherein said means for coupling are substantially equal capacitors.

16. The three state gate of claim 15 wherein said means for coupling are substantially equal capacitors.

* * * * *